US011798521B2

(12) United States Patent
Umentani

(10) Patent No.: US 11,798,521 B2
(45) Date of Patent: Oct. 24, 2023

(54) COMPUTATION DESIGN OF ACOUSTIC RESONATORS

(71) Applicant: AUTODESK, INC., San Francisco, CA (US)

(72) Inventor: Nobuyuki Umentani, Toronto (CA)

(73) Assignee: AUTODESK, INC., San Francisco, CA (US)

( * ) Notice: Subject to any disclaimer, the term of this patent is extended or adjusted under 35 U.S.C. 154(b) by 748 days.

(21) Appl. No.: 15/650,819

(22) Filed: Jul. 14, 2017

(65) Prior Publication Data

US 2018/0025708 A1 Jan. 25, 2018

Related U.S. Application Data

(60) Provisional application No. 62/364,698, filed on Jul. 20, 2016.

(51) Int. Cl.
*G10D 9/08* (2020.01)
*G10H 1/00* (2006.01)
(Continued)

(52) U.S. Cl.
CPC ........... *G10D 9/08* (2020.02); *G06F 3/04812* (2013.01); *G06F 30/00* (2020.01); *G06F 30/20* (2020.01);
(Continued)

(58) Field of Classification Search
CPC ... G10D 9/08; G10D 9/10; G10D 9/00; G06F 30/20; G06F 3/04812; G06F 30/00;
(Continued)

(56) References Cited

U.S. PATENT DOCUMENTS

| 5,894,310 A | * | 4/1999 | Arsenault | ............... G06T 19/00 |
| | | | | 345/679 |
| 2016/0136883 A1 | * | 5/2016 | Schmidt | ............... B29C 64/386 |
| | | | | 264/129 |
| 2018/0131404 A1 | * | 5/2018 | Zhang | .................. H04B 1/7113 |

FOREIGN PATENT DOCUMENTS

WO WO-2016049728 A1 * 4/2016 ............. G06F 17/50

OTHER PUBLICATIONS

Lefebvre, Antoine, Gary P. Scavone, and Jean Kergomard. "External Tonehole Interactions in Woodwind Instruments." arXiv preprint arXiv:1207.5490 (2012). (Year: 2012).*

(Continued)

*Primary Examiner* — Boris Gorney
*Assistant Examiner* — Joshua E. Jensen
(74) *Attorney, Agent, or Firm* — Artegis Law Group, LLP

(57) ABSTRACT

One embodiment of the present application sets forth a method for simulating an audio output of a three-dimensional object that includes a resonant cavity. The method includes receiving an input mesh of a three-dimensional shape and a hole configuration. The input mesh has an outer surface and an internal cavity, and the hole configuration includes one or more holes. The method further includes adding the one or more holes to the three-dimensional shape based on the hole configuration to generate a modified three-dimensional shape having a resonant cavity. The resonant cavity includes the one or more holes and the internal cavity. The method further includes determining an air pressure coefficient matrix for the resonant cavity. The method further includes computing a minimum non-zero eigenvalue for the air pressure coefficient matrix. The method further includes determining an output resonant frequency for the resonant cavity based on the minimum non-zero eigenvalue.

23 Claims, 8 Drawing Sheets

(51) Int. Cl.
| | |
|---|---|
| G06F 3/04812 | (2022.01) |
| G06T 19/20 | (2011.01) |
| G10H 1/44 | (2006.01) |
| G10H 5/00 | (2006.01) |
| G10D 7/02 | (2020.01) |
| G06F 30/00 | (2020.01) |
| G06F 30/20 | (2020.01) |

(52) U.S. Cl.
CPC .............. *G06T 19/20* (2013.01); *G10D 7/02* (2013.01); *G10H 1/0008* (2013.01); *G10H 1/44* (2013.01); *G10H 5/007* (2013.01); *G06T 2219/2021* (2013.01); *G10H 2230/155* (2013.01)

(58) Field of Classification Search
CPC ...... G06T 19/20; G10H 5/007; G10H 1/0008; G10H 1/44
See application file for complete search history.

(56) References Cited

OTHER PUBLICATIONS

Lefebvre, Antoine. Computational acoustic methods for the design of woodwind instruments. Diss. McGill University Library, 2010. (Year: 2010).*

Umetani, Nobuyuki, Jun Mitani, and Takeo Igarashi. "Designing Custom-made Metallophone with Concurrent Eigenanalysis." NIME. vol. 10. 2010. (Year: 2010).*

Kirkup, Stephen Martin. The boundary element method in acoustics. Integrated sound software, 2007. (Year: 2007).*

IMAGINiT Technolgies "Autodesk Inventor Tips & Tricks - Placing Features On Cylindrical Shapes" https://web.archive.org/web/20130811023443/https://blogs.rand.com/files/placing-features-on-cylindrical-shapes.pdf retrieved May 13, 2021 (Year: 2013).*

Bai, Mingsian R. "Study of acoustic resonance in enclosures using eigenanalysis based on boundary element methods." The Journal of the Acoustical Society of America 91.5 (1992): 2529-2538. (Year: 1992).*

Moosrainer, Marold, and Helmut Fleischer. "Application of BEM and FEM to musical instruments." Estorff, O. v.(Hrsg.), Boundary Elements in Acoustics-Advances and Applications, WIT Press, Southampton/Boston 2000, 377 410 (2000). (Year: 2000).*

Howie, V. E., and Lloyd N. Trefethen. "Eigenvalues and musical instruments." Journal of computational and applied mathematics 135.1 (2001): 23-40. (Year: 2001).*

Allen et al., "Aerophones in Flatland: Interactive Wave Simulation of Wind Instruments", ACM Transactions on Graphics, vol. 34, No. 4, Article 134, Publication Date: Aug. 2015, pp. 134:1-134:11.

Bächer et al., "Spin-It: Optimizing Moment of Inertia for Spinnable Objects", ACM Trans. Graph, vol. 33, No. 4 Jul. 2014, pp. 96:1-96:10.

Benade et al., "Survey of impedance methods and a new piezo-disk-driven impedance head for air columns", The Journal of the Acoustical Society of America 81, 4, 1987, 1152-1167.

Bharaj et al., "Computational design of metallophone contact sounds", ACM Trans. Graph. vol. 34, No. 6, Oct. 2015, pp. 223:1-223:13.

Bonneel et al.,"Fast modal sounds with scalable frequency-domain synthesis", ACM Trans. Graph, vol. 27, No. 3 Aug. 2008, pp. 24:1-24:9.

Brüning et al., "Calculation of the kirchhoff coefficients for the helmholtz resonator", Russian Journal of Mathematical Physics, 2009, vol. 16, No. 2, pp. 188-207.

Coifman et al., "The Fast Multipole Method for the Wave Equation: A Pedestrian Prescription", IEEE Antennas and Propagation Magazine, 1993, vol. 35, No. 3, pp. 7-12.

Cook, P. R., TBone: An interactive waveguide brass instrument synthesis workbench for the next machine. In Proceedings of the International Computer Music Conference, 1991, 297-299.

Elkoura et al., "Handrix: Animating the Human Hand" In Proceedings of the 2003, ACM SIGGRAPH/Eurographics symposium on Computer animation, Eurographics Association, pp. 110-119.

Funkhouser et al., "Real-time acoustic modeling for distributed virtual environments", In Proceedings of SIGGRAPH, pp. 365-374.

Giordano, N., "Simulation studies of a recorder in three dimensions", The Journal of the Acoustical Society of America vol. 135, No. 2, Feb. 2014, pp. 906-916.

Hirschberg et al., "Aeroacoustics of Musical Instruments", Meccanica vol. 31, No. 2, 1996, 131-141.

Garashi et al., Teddy: A sketching Interface for 3d Freeform Design, In Proceedings of SIGGRAPH, 1999, pp. 409-416.

James et al., "Precomputed acoustic transfer: Output-sensitive, accurate sound generation for geometrically complex vibration sources", ACM Trans., 2006 Graph, vol. 25, No. 3, July, pp. 987-995.

Kirkup, S. M., "The Boundary Element Method in Acoustics": A Development in Fortran (Integral Equation Methods in Engineering). Integrated Sound Software, 1998, 9-11.

Lefebvre et al., "Characterization of woodwind instrument toneholes with the finite element method", The Journal of the Acoustical Society of America vol. 131, No. 4, 2012, pp. 3153-3163.

Li et al., Interactive acoustic transfer approximation for modal sound. ACM Transactions on Graphics, 2015, vol. 35, No. 1, 15 pages.

Li et al., "Acoustic Voxels: Computational optimization of modular acoustic filters", ACM Trans. Graph, (to appear), 2016, vol. 35, No. 4, Jul. 2016, 12 pages.

Lorenzoni et al., Embracing the digital in instrument making: Towards a musician-tailored mouthpiece by 3d printing. In Proceedings of the Stockholm Music Acoustics Conference, 2013, pp. 419-424.

Lu et al., "Build-to-last: Strength to weight 3d printed objects", ACM Trans. Graph. 33, 4 Jul. 2014, pp. 97:1-97:10.

Mohring, J., "Helmholtz resonators with large aperture", Acta Acustica united with Acustica, 1999, vol. 85, No. 6, pp. 751-763.

O'Brien et al., "Synthesizing sounds from physically based motion", In Proceedings of SIGGRAPH 2001, pp. 529-536.

Prévost et al., "Make it stand: Balancing shapes for 3d fabrication", ACM Trans. Graph., vol. 32, No. 4 Jul. 2013, pp. 81:1-81:10.

Raghuvanshi et al., "Precomputed wave simulation for real-time sound propagation of dynamic sources in complex scenes", ACM Trans. Graph., vol. 29, No. 4 Jul. 2010 pp. 68:1-68:11.

Ren et al., "Example-guided physically based modal sound synthesis", ACM Trans. Graph, vol. 32, No. 1 Feb. 2013, pp. 1:1-1:16.

Schoofs et al., "I. computation of bell profiles using structural optimization", Music Perception: An Interdisciplinary Journal, 1987, vol. 4, No. 3, pp. 245-254.

Tsingos et al., "Modeling acoustics in virtual environments using the uniform theory of diffraction", In Proceedings of SIGGRAPH 2001, pp. 545-552.

Umetani et al., "Designing custom-made Metallophone with concurrent Eigenanalysis", NIME, 2010, 5 pages.

Van Den Doel et al., "Foleyautomatic: Physically-based sound effects for interactive simulation and animation", In Proceedings of SIGGRAPH 2001, pp. 537-544.

Van Der Vorst, H. A. Van Der., "Bi-cgstab: A fast and smoothly converging variant of bi-cg for the solution of nonsymmetric linear systems", SIAM J. Sci. Stat. Comput,Mar. 1992, vol. 13, No. 2, pp. 631-644.

Wang et al., "Buoyancy optimization for computational fabrication", Comput. Graph. Forum, 2016, vol. 35, No. 2, pp. 49-58.

Yokoyama et al., "Direct numerical simulation of fluid—acoustic interactions in a recorder with tone holes", The Journal of the Acoustical Society of America, 2015, vol. 138, No. 2, pp. 858-873.

Zheng et al., "Rigid-body fracture sound with precomputed soundbanks", ACM Trans. Graph, vol. 29, No. 4 Jul. 2010, pp. 69:1-69:13.

Zheng et al., "Toward high-quality modal contact sound", ACM Trans. Graph. vol. 30, No. 4 Jul. 2011, pp. 38:1-38:12.

Da Silva, A. R. Numerical studies of aeroacoustic aspects of wind instruments. PhD thesis, McGill University, Montreal, Quebec, Canada, Oct. 2008, 235 pages.

(56) References Cited

OTHER PUBLICATIONS

Bai et al. Templates for the Solution of Algebraic Eigenvalue Problems: A Practical Guide. Society for Industrial and Applied Mathematics, Philadelphia, PA, 2000. May 21, 1999 Draft Version at https://www.math.unm.edu/~vageli/courses/Ma504/EigTemplatesBook990607.ps, 316 pages.

Fletcher et al. The Physics of Musical Instruments. Springer, 2nd ed., 1998, 88 pages.

Hirschman, S. E. Digital Waveguide Modeling and Simulation of Reed Woodwind Instruments. PhD thesis, Stanford University, Stanford, CA, Jul. 1991, 280 pages.

Musialski et al. Reduced-order shape optimization using offset surfaces. ACM Trans. Graph. 34, 4 (Jul. 2015), 102:1-102:9, 9 pages.

\* cited by examiner

COMPUTATION DESIGN OF ACOUSTIC RESONATORS

CROSS-REFERENCE TO RELATED APPLICATIONS

This application claims benefit of the U.S. Provisional Patent Application having Ser. No. 62/364,698 and filed on Jul. 20, 2016. The subject matter of this related application is incorporated herein by reference.

BACKGROUND OF THE INVENTION

Field of the Invention

Embodiments of the present invention relate generally to audio processing and design and, more specifically, to computation design of acoustic resonators.

Description of the Related Art

A wind instrument is an instrument that contains a resonator in the form of a resonant cavity that causes sound to radiate from the resonant cavity to a listener. More specifically, a wind instrument produces tones through acoustic resonance within the resonant cavity of the instrument. Interactions between sound wave propagation from blowing air through a mouthpiece and the geometry of the resonant cavity and other parts of the instrument magnify at specific frequencies. The player of the wind instrument changes the resonance by covering different holes to change the effective length and shape of the resonant cavity, thereby causing sound waves to resonate at different frequencies to produce different tones. Typically, wind instruments have been designed using tube-like shapes because the resonant properties of cylindrical shapes are well-understood. Based on the known properties of the resonant cavity, the size, material, hole placement, and various techniques for blowing have produced many variations of instruments, such as flutes, clarinets, recorders, trombones, and horns.

Although people have tried to vary the design of conventional cylindrical resonant cavities in the past, free-form design of resonant cavities and instruments including such resonant cavities has proven to be much more difficult. In particular, conventional approaches to computational acoustic design require iterative, time-consuming simulations across a wide spectrum of frequencies to determine the resonant frequencies of a given free-form resonant cavity. For example, a simulator would have to sweep through all frequencies within a large frequency range with step size of 0.1 Hz or smaller to determine accurately which tones could be produced from a given free-form resonant cavity. To the extent the designer then wanted to modify or tweak the design to have different tones produced from the resonant cavity, the design would have to modify the design accordingly and rerun the simulations. The designer would have to repeat this trial-error process in iterative fashion until settling on the final resonant cavity design.

Some previous solutions have attempted to work around the above problems by implementing two-dimensional simulations of wind instruments that are assumed to include cylindrical resonant cavities. However, because these simulations are two-dimensional, instead of three-dimensional, the simulation results do not translate accurately when fabricating the actual, physical three-dimensional wind instruments.

As the foregoing illustrates, what is needed in the art are more effective techniques for designing resonant cavities.

SUMMARY OF THE INVENTION

One embodiment of the present application sets forth a method for simulating an audio output of a three-dimensional object that includes a resonant cavity. The method includes receiving an input mesh of a three-dimensional shape and a hole configuration. The input mesh has an outer surface and an internal cavity, and the hole configuration includes one or more holes. The method further includes adding the one or more holes to the three-dimensional shape based on the hole configuration to generate a modified three-dimensional shape having a resonant cavity. The resonant cavity includes the one or more holes and the internal cavity. The method further includes determining an air pressure coefficient matrix for the resonant cavity. The method further includes computing a minimum non-zero eigenvalue for the air pressure coefficient matrix. The method further includes determining an output resonant frequency for the resonant cavity based on the minimum non-zero eigenvalue.

At least one advantage of the disclosed embodiments is that the simulator provides a fast method of simulating multiple frequencies for a free-form cavity, thereby enabling a user to find resonant frequencies for the cavity. The resonance simulator enables a user to interactively manipulate the structure of the three-dimensional shape by changing the size and placement of holes around the three-dimensional shape to produce output resonant frequencies that are approximately close to one or more targeted output resonant frequencies. As a result, enabling the user to easily simulate resonance and design free-form shapes to produce one or more targeted output tones based on the shape and placement of holes allows the user to design and fabricate free-form wind instruments based on designs of acoustic resonators produced in the simulator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
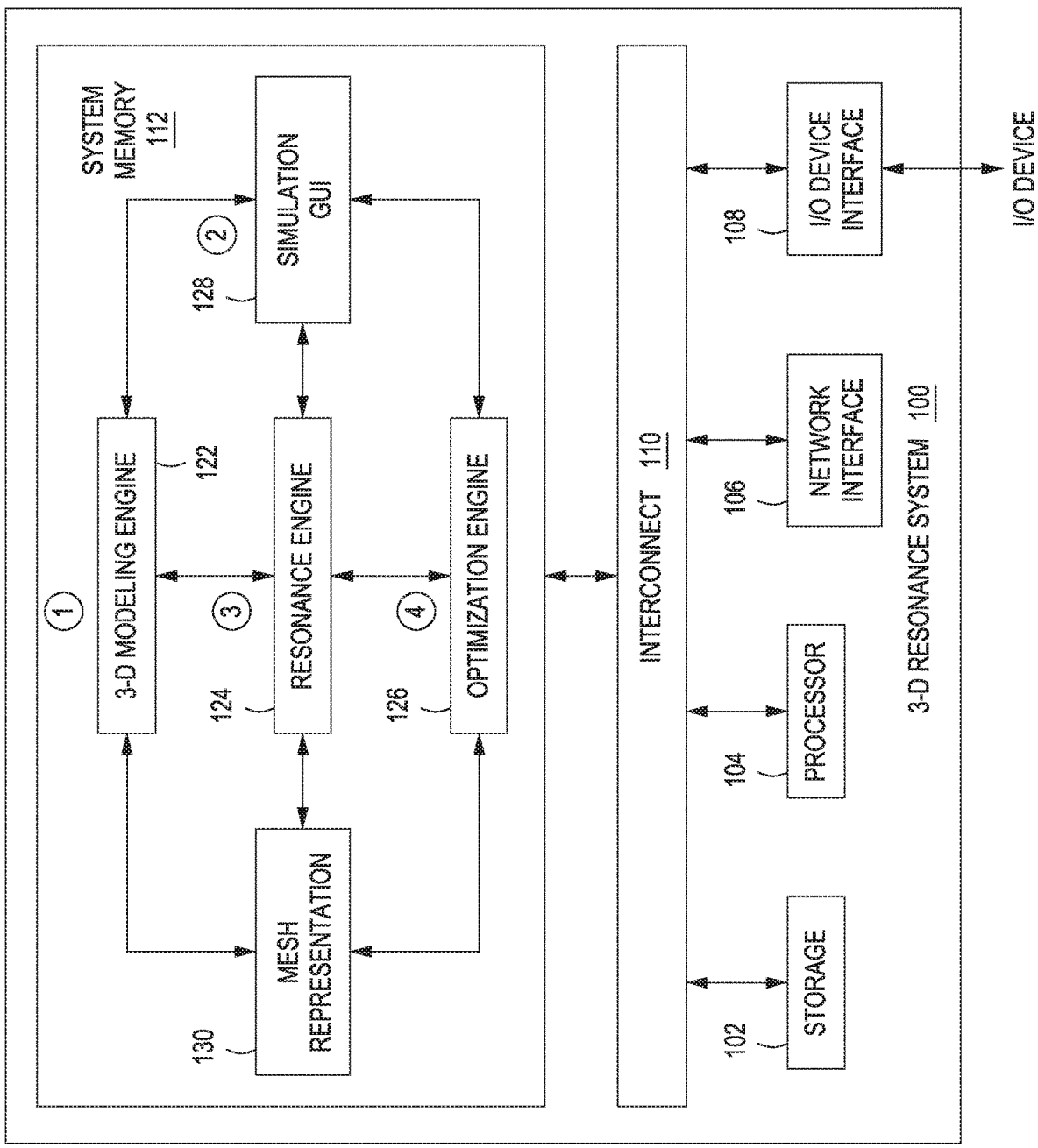
FIG. 1 illustrates a three-dimensional resonance system configured to implement one or more aspects of the present invention.

FIG. 1 illustrates a three-dimensional (3-D) resonance system 100 configured to implement one or more aspects of the present invention. As shown, 3-D resonance system 100 is a computing system that includes, without limitation, storage 102, a processor 104, a network interface 106, an input/output (I/O) device interface 108, an interconnect 110, and a system memory 112.

Storage 102 is connected to interconnect 110 and is configured to store content and applications and data for use by processor 104. Storage 102 provides non-volatile storage for applications and data and may include fixed or removable hard disk drives, flash memory devices, floppy disc drives, tape drives, removable memory cards, network-attached storage (NAS), a storage area-network (SAN), CD-ROM, DVD-ROM, Blu-ray, HD-DVD, or other magnetic, optical, or solid state storage devices. Although shown as a single unit, storage 102 may be a combination of fixed and/or removable storage devices.

Processor 104 is any technically-feasible form of processing device configured to process data and execute program code. Processor 104 may be, for example, a central processing unit (CPU), a graphics processing unit (GPU), an application-specific integrated circuit (ASIC), a field-programmable gate array (FPGA), and so forth. Processor 104 includes one or more processing cores. In operation, processor 104 is the master processor of 3-D resonance system 100, controlling and coordinating operations of other system components. Processor 104 retrieves and executes programming instructions stored in system memory 112. Similarly, processor 104 stores and retrieves application data residing in the system memory 112. In an aspect, processor 104 incorporates circuitry optimized for graphics and video processing, including, for example, video output circuitry. In an aspect, processor 104 may be integrated with one or more other system elements, such as interconnect 110 and I/O device interface 108 to form a system on chip (SoC).

Network adapter 106 allows 3-D resonance system 100 to communicate with other systems via an electronic communications network, and may include wired or wireless communication over local area networks and wide area networks such as the Internet.

I/O device interface 108 receives user input from one or more user input devices (e.g., keyboard, mouse, joystick, digitizer tablets, touch pads, touch screens, still or video cameras, motion sensors, and/or microphones) and forwards the input to processor 104 via interconnect 110. In an aspect, I/O device interface 108 may also include an audio output unit configured to generate an electrical audio output signal, and user I/O devices may further include a speaker configured to generate an acoustic output in response to the electrical audio output signal. Another example of a user I/O device could be a display device that generally represents any technically-feasible means for generating an image for display. For example, the display device could be a liquid crystal display (LCD) display, CRT display, or DLP display. In an aspect, the display device can be a TV that includes a broadcast or cable tuner for receiving digital or analog television signals.

Interconnect 110 facilitates transmission, such as of programming instructions and application data, between storage 102, the processor 104, network interface 106, I/O device interface 108, and system memory 112.

System memory 112 stores software applications and data for use by processor 104. Processor 104 executes software applications stored within system memory 112 and optionally an operating system. In particular, processor 104 executes software and then performs one or more of the functions and operations set forth in the present application. In an aspect, system memory 112 is generally included to be representative of a random access memory.

Other components (not shown), including USB or other port connections, film recording devices, and the like, may also be connected to I/O device interface 108. For example, an audio processor could be used to generate analog or digital audio output from instructions and/or data provided by storage 102, processor 104, and/or system memory 112. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

It will be appreciated that the system shown herein is illustrative and that variations and modifications are possible. The connection topology, including the number and arrangement of interconnects and bridges, may be modified as desired. For instance, in an aspect, system memory 112 can be connected to processor 104 directly rather than through interconnect 110, and other devices communicate with system memory 112 via interconnect 110 and processor 104. The particular components shown herein are optional.

System memory 112 includes, without limitation, a three-dimensional (3-D) modeling engine 122, a resonance engine 124, an optimization engine 126, a simulation graphical user interface (GUI) 128, and a mesh representation 130.

3-D modeling engine 122 retrieves a mesh representation 130 from system memory 112 and provides mesh representation 130 to the user via simulation GUI 128. In an aspect, 3-D modeling engine 122 may receive information from resonance engine 124, optimization engine 126, and/or the user via simulation GUI 128 to modify mesh representation 130. 3-D modeling engine 122 may then modify and provide a modified mesh representation 130 to simulation GUI 128. For example, 3-D modeling engine 122 could receive an indication, from a user via simulation GUI 128, to scale the size of mesh representation 130. 3-D modeling engine 122 could then enlarge or diminish mesh representation 130 based on the received indication and provide the modified mesh representation 130 to the user via simulation GUI 128.

In an aspect, 3-D modeling engine 122 receives a hole configuration from resonance engine 124, optimization engine 126, and/or simulation GUI 128. The hole configuration includes the quantity of holes, along with the diameter, depth, and location of each hole on mesh representation 130. Each hole in the hole configuration spans from the outer surface to the inner cavity of mesh representation 130. The hole configuration includes a fipple hole that is configured as a mouthpiece to receive air from a player of the three-dimensional object, and one or more finger holes, which the player covers or leaves uncovered during play to produce different resonant frequencies as output tones. In some embodiments, the hole configuration may also include a finger hole pattern that indicates of whether or not each hole is covered. In an aspect, 3-D modeling engine 122 could modify mesh representation 130 by adding holes to mesh representation 130 based on the hole configuration. For example, 3-D modeling engine 122 could receive a hole configuration from the user via simulation GUI 128 and could add holes to mesh representation 130 based on the hole configuration.

Resonance engine 124 provides an output resonant frequency for mesh representation 130 that includes a hole configuration. In an aspect, resonance engine 124 computes and simulates a resonant frequency based on the shape of mesh representation 130, including the volume and shape of the resonant cavity, which includes the inner cavity and any holes on mesh representation 130 that are covered or uncovered. As will be discussed in further detail in relation to FIG. 6B, resonance engine 124 determines an air pressure coefficient matrix for the resonant cavity and uses the air pressure coefficient matrix to determine an output resonant frequency by computing a minimum, non-zero eigenvalue for the air pressure coefficient matrix and determining the output resonant frequency from the minimum, non-zero eigenvalue.

In an aspect, resonance engine 124 updates the output resonance frequency based on changes to the hole configuration of mesh representation 130. In an aspect, resonance engine 124 receives updated hole configurations from 3-D modeling engine 122, which receives the updated hole configuration from optimization engine 126 or from the user via simulation GUI 128. For example, resonance engine 124 could receive a modified hole configuration from 3-D modeling engine 122 after 3-D modeling engine 122 scales mesh representation 130. In another example, resonance engine 124 could receive a manually-modified hole configuration from a user via simulation GUI 128. As will be discussed in further detail in relation to FIG. 6C, resonance engine 124 identifies one or more modified vertices in the inner cavity of mesh representation 130 that were change due to the modified hole configuration and updates the air pressure coefficient matrix of the resonant cavity based on the modified vertices. Resonance engine 124 then updates the output resonance frequency for the resonant cavity based on the updated air pressure coefficient matrix.

Optimization engine 126 modifies the hole configuration of mesh representation 130 to approximate one or more target output resonant frequencies for the three-dimensional shape to produce. In some embodiments, optimization engine 126 may receive a set of target output resonant frequencies. Optimization engine 126 may also receive a target quantity of finger holes and/or finger hole patterns to achieve the output resonant frequencies through the available finger hole patterns. Optimization engine 126 receives mesh representation 130 from 3-D modeling engine 122 and/or retrieves mesh representation 130 from system memory 112. Optimization engine 126 modifies the sizes of one or more finger holes on mesh representation 130 to minimize differences between a set of output resonant frequencies for the finger hole patterns of updated mesh representation 130 and the set of target output resonant frequencies. In some embodiments, optimization engine 126 may employ a real-time tone estimation by estimating the output resonant frequency of the resonant cavity as a function of a modifications to diameters of one or more holes on mesh representation 130. When optimization engine 126 modifies the hole configuration of mesh representation 130, optimization engine 126 sends the modified hole configuration to 3-D modeling engine 122.

In alternative embodiments, optimization engine 126 may add holes to mesh representation 130, remove holes from mesh representation 130, and/or modify locations of one or more holes on mesh representation 130. Optimization engine 126 may iterate modifications of the hole configuration of mesh representation 130 multiple times before generating a final modified hole configuration. Optimization engine 126 may generate the final modified hole configuration that optimizes the hole configuration of mesh representation 130 to minimize differences between the target output resonant frequencies and the output resonant frequencies of the three-dimensional shape, as determined by resonance engine 124 for the modified mesh representation 130.

Simulation GUI 128 provides an interface for a user, via I/O device interface 108, to interact with mesh representation 130 and indicate modifications and/or request actions from 3-D modeling engine 122, resonance engine 124, and/or optimization engine 126. In an aspect, simulation GUI 128 enables the user to play output resonant frequencies of mesh representation 130 based on output resonant frequencies determined by resonance engine 124. In an aspect, simulation GUI 128 provides to the user an output resonant frequency for each finger hole pattern that a player of the three-dimensional object can employ. In some embodiment, the user can listen to a specific output resonant frequency by clicking on a graphical representation of the finger hole pattern in simulation GUI 128. In an aspect, simulation GUI 128 provides one or more editing tools that enable the user modify mesh representation 130. For example, simulation GUI 128 could provide editing tools that enable the user modify mesh representation 130 by scaling, moving holes, changing diameters of one or more holes, and add or remove finger holes. In some embodiments, simulation GUI 128 may provide to the user an updated output resonant frequency for mesh representation 130 as the user makes a modification to mesh representation 130. In an aspect, simulation GUI 128 may automatically play the updated output resonant frequency as the user makes the modification mesh representation 130.

Mesh representation 130 may be a three-dimensional model of a three-dimensional physical object. Mesh representation 130 represents the three-dimensional object as a series of polygonal meshes. As will be discussed in further detail in relation to FIG. 2, mesh representation 130 includes an outer surface mesh and an inner cavity mesh, with connecting vertices approximating the outer surface mesh and inner cavity mesh. Mesh representation 130 also includes one or more holes inserted to span between the inner cavity mesh and outer surface mesh based on a hole configuration. In an aspect, mesh representation 130 includes a resonant cavity, which includes the inner cavity mesh and the holes inserted into mesh representation 130. In some embodiments, mesh representation 130 may include a uniform thickness between the inner cavity mesh and the outer surface mesh.

FIG. 1 illustrates how 3-D modeling engine 122, resonance engine 124, optimization engine 126, and simulation GUI 128 generate a three-dimensional object with a hole configuration and a specified output resonant frequency, according to various embodiments of the present invention.

For explanatory purposes only, a sequence of events involved in the modeling and resonance process is depicted using numbered bubbles. In alternative embodiments, modifications to the number of events, the sequence of events, and the events themselves will be apparent to those of ordinary skill in the art without departing from the scope and spirit of the described embodiments.

First, as depicted with the bubble numbered "1," 3-D modeling engine 122 retrieves mesh representation 130 in system memory 112. In an aspect, 3-D modeling engine 122 receives mesh representation 130 as an outer surface mesh of a three-dimensional shape and updates mesh representation 130 by generating an inner cavity mesh and adding the inner cavity mesh to mesh representation 130. In an aspect, mesh representation 130 may maintain a uniform thickness between the inner cavity mesh and the outer surface mesh. In an aspect, 3-D modeling engine 122 saves the updated mesh representation 130 in system memory 112.

As depicted with the bubble numbered "2," simulation GUI 128 receives mesh representation 130 from 3-D modeling engine 122. In alternative embodiments, simulation GUI 128 may retrieve mesh representation 130 from system memory 112. Simulation GUI 128 displays mesh representation 130 via I/O device interface 108 to the user. In an aspect, mesh representation 130 includes a hole configuration. For example, simulation GUI 128 could present to the user a mesh representation 130 that includes a fipple hole and two finger holes.

Sequentially, as depicted with the bubble numbered "3," resonance engine 124 simulates one or more output resonance frequencies for mesh representation 130. For example, if mesh representation 130 includes a hole configuration that has a fipple hole, a first finger hole, and second finger hole, resonance engine 124 could provide a predicted output resonant frequency for each of four finger hole patterns: (1) both holes open, (2) only the first hole closed, (3) only the second hole closed, and (4) both holes closed. In some embodiments, resonance engine 124 may provide to the user via simulation GUI 128 an audio signal at the output resonant frequency. In some embodiments, simulation GUI 128 can play audio signal via I/O device interface 108 for each possible finger pattern of mesh representation 130.

As depicted with the bubble numbered "4," optimization engine 126 may modify the hole configuration of mesh representation 130 based on an indication from the user via simulation GUI 128. In an alternative embodiment, optimization engine 126 may retrieve mesh representation 130 from system memory 112. In an aspect, optimization engine 126 receives one or more target output frequencies from the user via simulation GUI 128. In some embodiments, optimization engine 126 may also receive a quantity of finger holes to in which to produce each of the set of output resonant frequencies using at least one finger hole pattern. Optimization engine 126 modifies the sizes of one or more holes of mesh representation 130 to minimize a difference between one or more output resonant frequencies produced by an updated mesh representation 130 and the one or more of the set of target output resonant frequencies. In some embodiments, optimization engine 126 can change the location of one or more holes, add one or more holes, and/or delete one or more holes on mesh representation 130.

In alternative embodiments, optimization engine 126 may iterate modifying the hole configuration of mesh representation 130. Optimization engine 126 may receive multiple indications to modify the hole configuration of mesh representation 130, converging towards a final hole configuration for mesh representation 130 that optimizes the hole configuration to minimize differences between the set of target resonant frequencies and output resonant frequencies produced by mesh representation 130 with the final hole configuration. When optimization engine 126 modifies the hole configuration, optimization engine 126 sends the modified hole configuration to resonance engine 124, 3-D modeling engine 122, and/or the user via simulation GUI 128. Once mesh representation 130 includes the final hole configuration, 3-D modeling engine 122 may save the mesh representation 130 as a final mesh representation 130 in system memory 112. In an aspect, as user retrieves final mesh representation 130 to produce a three-dimensional physical object that includes the final hole configuration.

Figure 2:
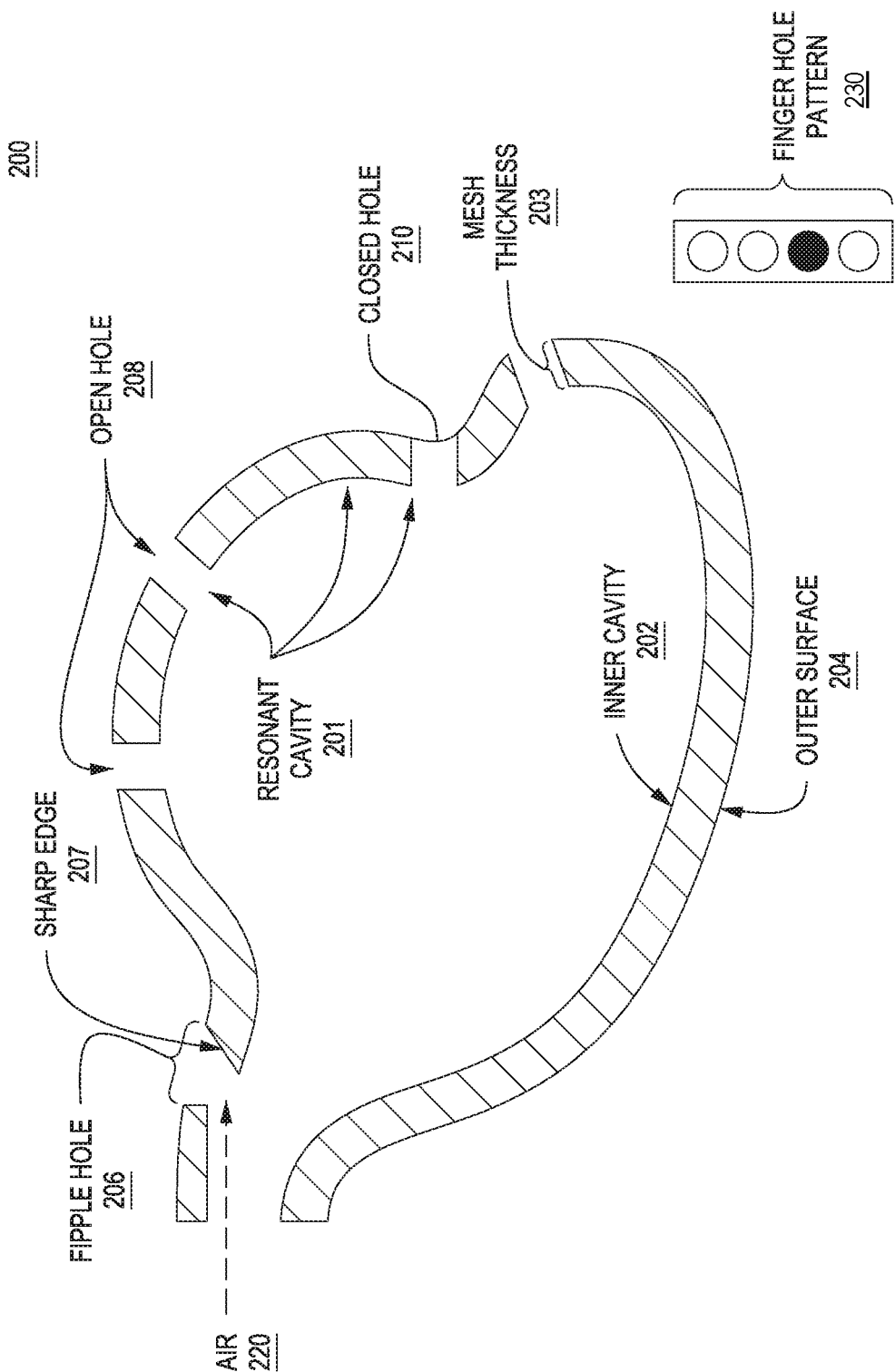
FIG. 2 illustrates a cross-section of a three-dimensional object, according to various embodiments of the present invention.

FIG. 2 illustrates a cross-section of a three-dimensional object, according to various embodiments of the present invention. Three-dimensional (3-D) object 200 is a freeform object with resonant cavity 201 that may be represented by mesh representation 130. 3-D object 200 includes an inner cavity 202, a thickness 203, an outer surface 204, a fipple hole 206, a sharp edge 207, and finger holes. The finger holes include one or more open holes 208 and one or more closed holes 210. In some embodiments, 3-D object 200 may be an irregular object that includes a concave inner cavity. In some embodiments, each of open holes 208 and closed hole 210 has a uniform thickness 203 between inner cavity 202 and outer surface 203.

When played, open hole 208 is not covered by a finger of the player, while closed hole 210 has a finger of the player cover the opening closed hole 210 on outer surface 204. When a player of 3-D object blows air 220 through the fipple hole 206 and contacts sharp edge 207, a sound wave propagates through resonant cavity 201. Resonant cavity 201 includes inner cavity 202, fipple hole 206, open holes 208, and closed hole 210, with sound emanating from resonant cavity 201 through fipple hole 206 and any open holes 208. For finger hole pattern 230, specific finger holes 206, 208 of 3-D object 200 are either open or closed, with a clear circle indicating an open hole and a colored circle indicating a closed hole.

In an aspect, resonance engine 124 may calculate the output resonant frequency of resonant cavity 201 based on the shape of inner cavity 202, location, size, and thickness of holes 206, 208, 210, and finger hole pattern 230 indicating which of finger holes 208, 210 are covered or uncovered. In some embodiments, resonance engine 124 may determine an output resonant frequency for each possible finger hole pattern 230. For example, 3-D shape 200 can include three total finger holes: two open holes 208 and one closed hole 210; resonance engine 124 can determine and provide an output resonant frequency for each of the $2^3$ possible finger hole patterns.

In an aspect, resonance engine 124 approximates the output resonant frequency of resonant cavity 201 of 3-D object 200 by approximating the air pressure coefficient matrix of resonant cavity 201 as if inner cavity 202 were totally enclosed. Because the holes 206, 208, 210 are small relative to the surface area of inner cavity 202, the air pressure coefficient matrix is nearly Hermitian. When the air pressure coefficient matrix is Hermitian, real eigenvalues solve the air pressure coefficient matrix, with the minimum eigenvalue that solves the air pressure coefficient matrix being zero for some wave number. Resonance engine 124 approximates resonant cavity 201, including open holes 208 and closed hole 210, using a near-Hermitian air pressure coefficient matrix, with eigenvalues that solve the near-Hermitian air pressure coefficient matrix having minimal imaginary components. Resonance engine 124 then calculates a minimum, non-zero eigenvalue and finds a corresponding resonance wave number for that eigenvalue. In an aspect, resonance engine 124 samples a discrete number of wave numbers and subtracts the sampled wave number from the real part of the minimum, non-zero eigenvalue to determine the resonant wave number. Resonance engine 124 then converts the resonant wave number to determine a resonance frequency based on the speed of sound. Resonance engine 124 then provides the resonance frequency as an output resonance frequency for resonant cavity 124.

Figure 3:
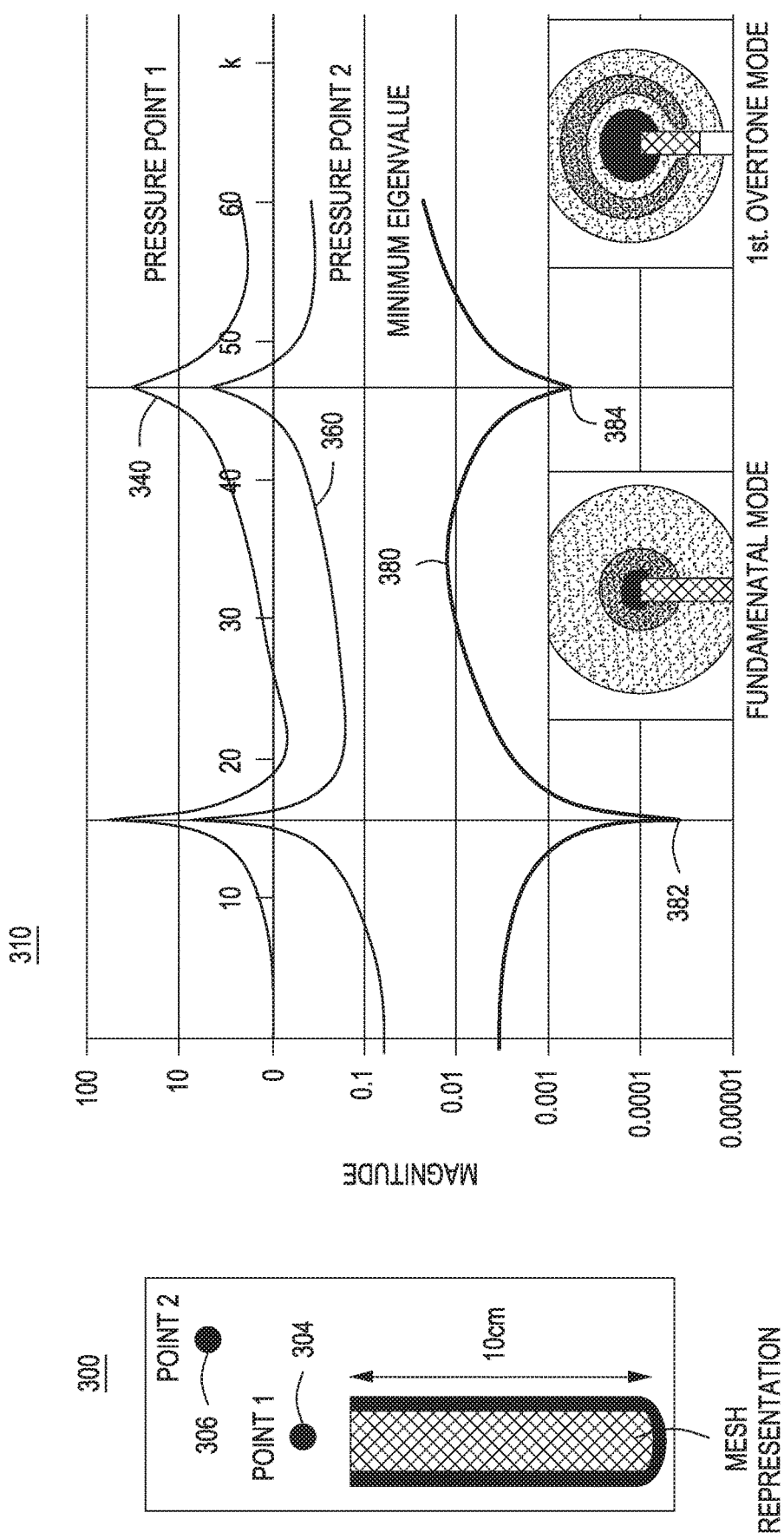
FIG. 3 illustrates a graph of air pressure measured at multiple observation points for a resonant cavity, according to various embodiments of the present invention.

FIG. 3 illustrates a graph of air pressure measured at multiple observation points for a resonant cavity, according to various embodiments of the present invention. Observation system 300 includes a mesh representation 302, a first observation point 304, and a second observation point 306. Graph 310 illustrates the magnitude of observed pressure at specified wave numbers at observation points 304, 306. For example, mesh representation 302 could be mesh representation 130 of a cylinder that produces a sound based on sound wave propagation inside resonant cavity 201. Observation points 304, 306 receive the sound waves propagating from mesh representation 302.

In an aspect, resonance engine 124 models sound waves emanating from mesh representation 302 such that measurements of the sound wave made at the different observation points 304, 306 have minimal differences. As illustrated in graph 310, first observation point 304 receives a stronger first observed sound wave 340 than second sound wave 360 received by second observation point 306.

Under conventional approaches, output resonance frequencies of the mesh representation 302 would be determined by finding the frequency where pressure at an observation point 304, 306 is at its maximum from a specific source point. In order to find the maximum pressure, a conventional testing device would perform a frequency sweep by determining the pressure for a large number of frequencies. For example, in a frequency range of 400 to 1200 Hz, the conventional testing device would determine the output pressure emanating from mesh representation 302 for each frequency at 0.1 Hz increments, which is very computationally intensive.

In an aspect, resonance engine 124 compares the overall magnitudes of the incident excitation pressure and the reflection pressure on the surface of resonant cavity 201. The air pressure coefficient matrix for resonant cavity 201 is proportional to the magnitude of the incident air pressure against the surface of resonant cavity 201 compared to the reflected air pressure from the surface of resonant cavity 201. Resonance engine 124 determines resonance for resonant cavity 201 of mesh representation 302 as the frequency where the magnitude of the reflection pressure at inner cavity 201 is at its maximum compared to the incident pressure at inner cavity 201. As illustrated by minimum eigenvalue line 380, the minimum eigenvalue for the air pressure coefficient matrix of resonant cavity 201 for mesh representation 302 is not based on the observation point 304, 306 of the sound wave emanating from mesh representation 302. In an aspect, resonance engine 124 determines the output resonant frequency of mesh representation 302 by only determining the dominant tone for mesh representation 302, which is the lowest passive frequency of resonant cavity 201. In an aspect, the dominant tone corresponds to minimum, non-zero eigenvalue 382. In alternative embodiments, resonance engine 124 may also determine resonant frequencies corresponding to other minimum, non-zero eigenvalues, such as minimum eigenvalue 384 corresponding to the first overtone of mesh representation 302. In such instances, resonance engine 124 may determine an output audio signal that includes timbre from the dominant tone and one or more overtones.

Figure 4:
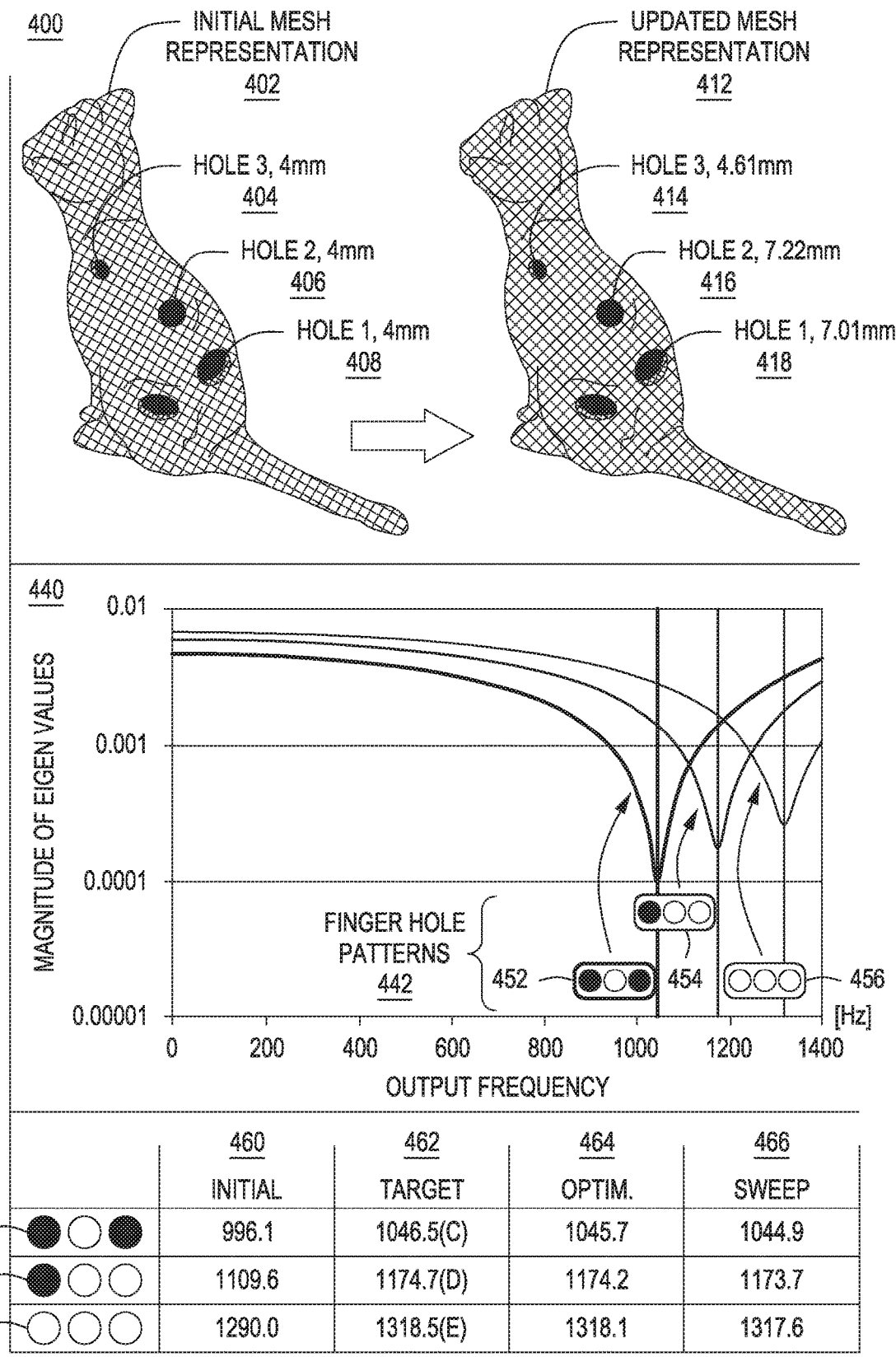
FIG. 4 is a conceptual illustration of how the three-dimensional resonance system of FIG. 1 optimizes where to place a set of holes on a mesh representation, according to various embodiments of the present invention.

FIG. 4 is a conceptual illustration of how the three-dimensional resonance system 100 of FIG. 1 optimizes where to place a set of holes 206, 208, 210 on a mesh representation 130, according to various embodiments of the present invention. Illustration 400 includes an initial mesh representation 402 including initial holes 404, 406, 408 and updated mesh representation 412, including modified holes 414, 416, 418. In some embodiments, mesh representations 402, 412 may be similar to a mesh representation 130 and may be stored in system memory 112. Graph 440 includes minimum eigenvalues at output frequencies between 0 Hz and 1400 Hz for finger hole patterns 442 corresponding to updated mesh representation 412. Graph 440 also includes a comparison of simulated output frequencies using an initial hole configuration 460, a target hole configuration 462, a modified hole configuration generated by optimization engine 126, and a modified hole configuration using a conventional frequency sweep approach.

In an aspect, 3-D modeling engine 122 provides to optimization engine 126 an initial mesh representation 402 that includes an initial hole configuration including initial holes 404, 406, 408. In some embodiments, optimization engine 126 may receive, from the user via simulation GUI 128, an indication to optimize the initial hole configuration for initial mesh representation 402 to produce a set of target output resonant frequencies. In alternative embodiments, optimization engine 126 may automatically optimize initial hole configuration 402 based on an indication to produce the set of target output resonant frequencies when 3-D modeling engine 122 retrieves initial hole configuration 402 from system memory 112.

In an aspect, optimization engine 126 modifies initial holes 404, 406, 408 using a real-time tone estimation approach to tune the initial holes 404, 406, 408 to updated holes 414, 416, 418 that have different diameters. Optimization engine 126 generates updated mesh representation 412 such that updated mesh representation 412 minimizes the difference between the target output frequencies and output resonant frequencies produced by the updated mesh representation. In an aspect, optimization engine 126 implements real-time tone estimation by approximating the change in resonant frequency of updated mesh configuration 412 as a function of a difference in diameters for at least one of holes 414, 416, 418. For example, optimization engine 126 could compute an output resonance sensitivity as a non-linear partial derivative of the resonant wave number to the hole diameter.

In some embodiments, optimization engine 126 implementing real-time tone estimation based on differences in hole diameters may be faster than an tone estimation based on a movement of one or more hole locations, as optimization engine 126 and/or resonance engine 124 may not need to identify which modified vertices in inner cavity 202 and update the air pressure coefficient matrix based on the modified vertices. In alternative embodiments, optimization engine 126 may iterate modifying the the hole configuration by first changing the position of initial holes 404, 406, 408, then modifying the diameters of initial holes 404, 406, 408 to provide a modified hole configuration of updated mesh representation 412 that includes holes 414, 416, 418. In some embodiments, optimization engine 126 may implement real-time tone estimation significantly faster than conventional resonance optimization approaches, as optimization engine 126 may only take seconds (e.g., 2-30 seconds) to implement each real-time tone estimation.

Graph 440 illustrates magnitudes of eigenvalues for each of three finger hole patterns 442 for updated mesh representation 412. In an aspect, optimization engine 126 tunes initial mesh representation 402 until at least one finger hole pattern is within a threshold of a target output resonant frequency. In some embodiments, optimization engine 126 may tune initial mesh representation 402 until each target output frequency is within the threshold of an output resonant frequency of at least one finger hole pattern for updated mesh representation 412. In some embodiments, each target output resonant frequency may correspond to a tone on a musical scale. As shown in the corresponding table for graph 440, finger hole patterns 452, 454, 456 for initial mesh representation 402 each provide initial output resonant frequencies 460.

When tuning initial mesh representation 402, optimization engine 126 receives the set of target output resonant frequencies 462. For example, each one of the set of target output resonant frequencies correspond to a musical tone (e.g., a target resonant frequency of 1046.5 Hz corresponding to "C" on a musical scale). When optimization engine 126 receives an indication to optimize initial mesh representation 402 to approximate the set of target output resonant frequencies 462, optimization engine 126 could, for example, modify the diameters of initial holes 404, 406, 408 via real-time tone estimation that the optimized output resonant frequencies 464 of the updated mesh representation 412 are within a specified threshold to target output resonant frequencies 462. As shown in column 464, optimization engine 126 provides a finger configuration 452 for updated mesh representation 412 that produces an optimized output resonant frequency 464 within 1 Hz of target output frequency 462. In some embodiments, optimized output resonant frequency 464 may be within 2-5 Hz of target output resonant frequency 462.

In some embodiments, optimization engine 126 compares favorably to using a conventional frequency sweeping technique. A system using the conventional frequency sweeping technique calculates the minimum eigenvalue for each 0.1 Hz frequency interval. As shown by column 466, the conventional frequency sweep technique does not provide significantly better results, even though the technique is much more computationally intensive and takes much longer to complete. For example, optimization 126 could estimate an output resonant frequency for initial mesh representation 402 in approximately 14 s; a system implementing the frequency sweep technique could require approximately 2 m, 15 s to estimate an output frequency for initial mesh representation 402.

Figure 5:
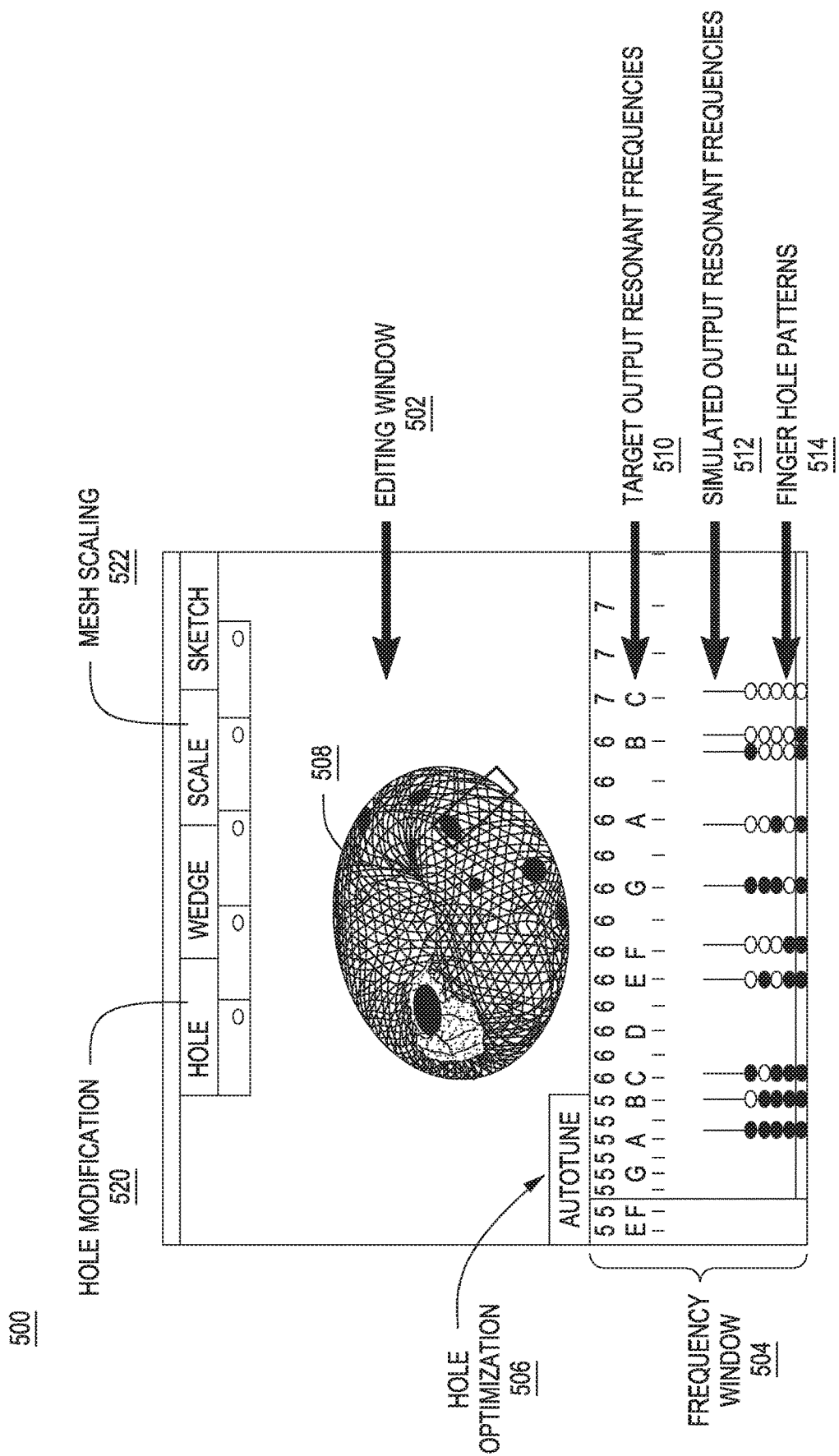
FIG. 5 illustrates a portion of the simulation graphical user interface (GUI) of FIG. 1, according to various embodiments of the present invention.

FIG. 5 illustrates a portion of the simulation graphical user interface (GUI) 126 of FIG. 1, according to various embodiments of the present invention. GUI 500 is similar to simulation GUI 128 and enables a user play simulated output frequencies 460, 464 for specific finger hole patterns 230 of mesh representation 130. GUI 500 also enables the user to edit mesh representation 508 through by scaling the size of mesh representation 508, as well as modifying holes 206, 208, 210 on mesh representation 130. GUI 500 includes an editing window 502 and a frequency window 504. Editing window 502 includes a hole optimization button 506, mesh representation 508, a manual hole modification tab 520, and a manual mesh scaling tab 522. Frequency window 504 includes target output resonant frequencies 510, simulated output resonant frequencies 512, and finger hole patterns 514.

GUI 500 includes editing window 502, which displays editing tools to enable the user to modify mesh representation 508. Mesh representation 508 is similar to mesh representation 130. In an aspect, GUI 500 receives mesh representation 508 from 3-D modeling engine 122. In some embodiments, simulation GUI 128 may retrieve mesh representation 508 from system memory 112. The editing tools includes manual hole modification tab 520, which includes tools that enable the user to add and delete holes 206, 208, 210 on outer surface 204 of mesh representation 508. Manual hole modification tab 520 also includes tools that enable the user to modify the location and diameter of holes 206, 208, 210 on outer surface 204 of mesh representation 508. Holes 206, 208, 210 on mesh representation 508 spans from outer surface 204 to the inner cavity 202 of mesh representation 508 and have a thickness 203. In alternative embodiments, manual hole modification tab 520 includes tools to change the thickness of holes 206, 208, 210 by changing the surface of inner cavity 202 and/or outer surface 204. In an aspect, the editing tools also includes manual mesh scaling tab 522, which include tools that enable the user to enlarge or diminish the size of mesh representation 508.

In an aspect, editing window 502 includes hole optimization button 506 that enables the user to indicate to optimization engine 126 to modify the hole configuration of mesh representation 508. In some embodiments, editing window may also provide a tool that enables the user to specify a set of target output resonant frequencies 510 for mesh representation 508. In an aspect, the user inputs one or more target output resonant frequencies 510 via GUI 500 and may provide one or more finger hole patterns 514 to produce target output frequencies 508. In some embodiments, GUI 500 may send target output resonant frequencies and/or finger hole patterns 514 to optimization engine 126 to modify the hole configuration of mesh representation 508.

Frequency window 504 includes graphical representations of output resonant frequencies 512 relating to mesh representation 508. Target output resonant frequencies 510 illustrate a listing of target output frequencies. In some embodiments, each of target output resonant frequencies 510 may correspond to a musical tone for mesh representation 508 to produce using one of finger hole patterns 514. In some embodiments, GUI may enable the user to filter target output resonant frequencies 510 to only illustrate user-selected target output frequencies 510.

Simulated output resonant frequencies 512 illustrate an output resonant frequency 512 resonance engine 124 estimates for each finger hole pattern 514 of mesh representation 508. In an aspect, GUI 500 enables the user to select a simulated output resonant frequency 512 such that GUI 500 plays the corresponding audio signal of simulated output resonant frequency 512. In some embodiments, GUI 500 may automatically play the audio signal corresponding to an updated simulated output resonant frequency 512 as the user edits the hole configuration of mesh representation 508.

Finger hole patterns 514 illustrate one or more possible finger hole patterns 514 on mesh representation 508 based on the quantity of finger holes 208, 210 included in mesh representation 508. In some embodiments, GUI 500 may enable the user to filter the display to only show a user-selected set of finger hole patterns 514 that produce simulated output resonant frequencies 512 that approximate target output resonant frequencies 510. In an aspect, the user may determine that the simulated output resonant frequency 512 of a specific finger hole pattern 514 is within an acceptable threshold of a target output resonant frequency 510 when the line illustrating simulated output resonant frequency 512 nearly aligns with target output resonant frequency 510.

Figure 6A:
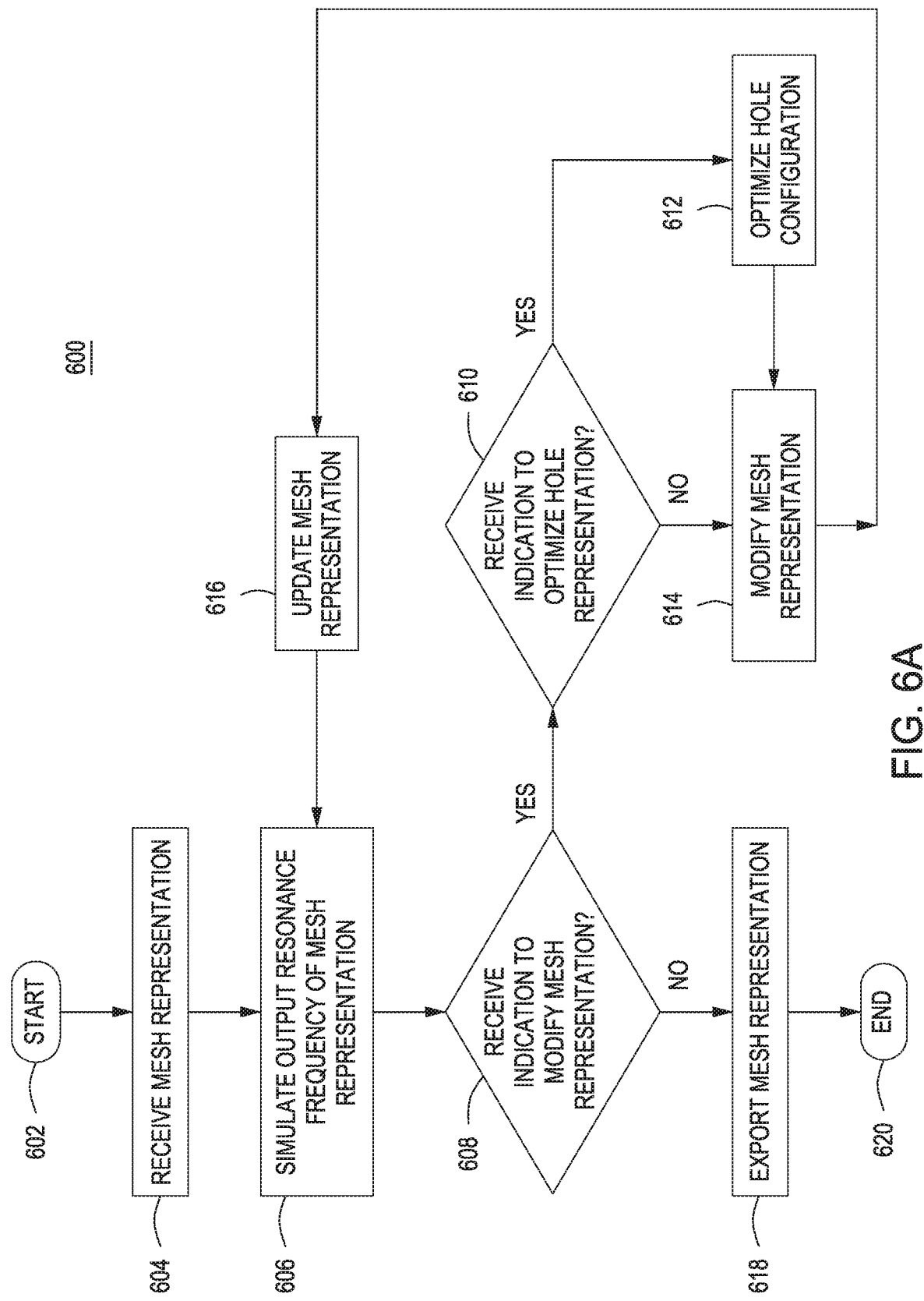
FIG. 6A sets forth a flow diagram of method steps for producing a free-form resonant three dimensional object, according to various embodiments of the invention.

FIG. 6A sets forth a flow diagram of method steps for producing a free-form resonant three dimensional object, according to various embodiments of the invention. Method 600 begins at step 602 and continues to step 604, where resonance engine 124 receives mesh representation 130. In some embodiments, resonance engine 124 may receive mesh representation 130 from 3-D modeling engine 122. In alternative embodiments, resonance engine 124 may retrieve mesh representation 130 from system memory 112. Mesh representation 130 represents a three-dimensional object 200. Mesh representation 130 includes an outer surface mesh, an inner cavity mesh, and mesh thickness.

At step 606, resonance engine 124 simulates an output resonance frequency 512 of mesh representation 130. In some embodiments, resonance engine 124 may simulate an output resonant frequency 512 of mesh representation 130 by determining an output resonance frequency 512 for each possible finger hole pattern 230 for the hole configuration of mesh representation 130. For example, if mesh representation 130 includes three holes, resonance engine 124 could determine an simulated output resonance frequency 512 for each of $2^3$ finger hole patterns 230.

As will be discussed in further detail in relation to FIG. 6B, resonance engine 124 determines output resonance frequency 512 of mesh representation 130 by determining an air pressure coefficient matrix for resonant cavity 201 of mesh representation 130. Resonant cavity 201 that includes inner cavity 202 and holes 206, 208, 210 of mesh representation 130. In an aspect, resonant engine 126 uses the air pressure coefficient matrix of resonant cavity 201 to determine an output resonant frequency 512 for mesh representation 130 by computing a minimum, non-zero eigenvalue that solves the air pressure coefficient matrix, and determines the corresponding resonant frequency as a function of the minimum, non-zero eigenvalue.

At step 608, 3-D modeling engine 122 determines whether an indication was received to modify mesh representation 130. In an aspect, 3-D modeling engine 122 receives an indication from a user via simulation GUI 128 to modify mesh representation 130. In alternative embodiments, 3-D modeling engine 122 receives an indication from an indication from optimization engine 126 to modify mesh representation 130. In some embodiments, the indication includes an indication to scale mesh representation 130. In some embodiments, the indication includes an indication to modify the hole configuration of mesh representation 130. If 3-D modeling engine 122 determines that an indication was received, 3-D modeling engine 122 proceeds to step 610; otherwise, 3-D modeling engine 122 proceeds to step 618.

At step 610, 3-D modeling engine 122 determines whether the received indication at step 608 was an indication to optimize the hole configuration of mesh representation 130. In an aspect, 3-D modeling engine 122 receives an indication from the user via simulation GUI 128 to optimize the hole configuration of mesh representation 130. In alternative embodiments, 3-D modeling engine 122 may receive an indication to optimize the hole configuration of mesh representation 130 automatically after receiving a set of target output resonant frequencies from the user via simulation GUI 128. If 3-D modeling engine 122 determines that the indication was an indication to optimize the hole configuration of mesh representation 130, 3-D modeling engine 122 proceeds to step 612; otherwise, 3-D modeling engine 122 proceeds to step 614.

At step 612, 3-D modeling engine 122 provides optimization engine 126 the indication to optimize mesh representation 130. In alternative embodiments, optimization engine 126 received the indication directly from the user via simulation GUI 128. In an aspect, optimization engine 126 modifies the diameters of one or more finger holes 208, 210 on mesh representation 130 to minimize differences between a set of target output resonant frequencies 510 and a set of output resonant frequencies 512 produced by mesh representation 130. When optimization engine 126 modifies the hole configuration, optimization engine 126 sends the modified hole configuration 3-D modeling engine 122.

At step 614, 3-D modeling engine 122 modifies mesh representation 508. In some embodiments, 3-D modeling engine 122 may receive modified mesh representation 508 from optimization engine 126. In alternative embodiments, 3-D modeling engine 122 may receive an indication of modifications to the hole configuration for mesh representation 508. Modified mesh representation 508 may include an optimized hole configuration 464 that minimizes the difference between output resonant frequencies 512 for one or more finger hole patterns 230 of mesh representation 130 and the set of target output resonant frequencies 510. In alternative embodiments, 3-D modeling engine includes an indication from the user via simulation GUI 128 to modify mesh representation 130. In such instances, the indication may include an indication to scale mesh representation 508. The indication may alternatively include an indication to modify one or more holes of the hole configuration for mesh representation 508. The indication to modify the hole configuration may include indications to modify the quantity of finger holes 208, 210, the location of one or more holes of the holes 206, 208, 210, and/or size of one or more of the holes 206, 208, 210.

At step 616, resonance engine 124 updates the mesh representation 508. As will be discussed in further detail in relation to FIG. 6C, resonance engine 124 updates output resonant frequencies 512 of mesh representation based on modifications 3-D modeling engine 122 made to mesh representation 130 in step 614. In an aspect, resonance engine 124 determines that modified mesh representation 130 is a different size than initial mesh representation 130. When resonance engine 124 determines that modified mesh representation 130 has been scaled, resonance engine 124 retrieves each resonant wave number from system memory 112. Resonance engine 124 then scales the corresponding output resonant frequency 512 by an inverse of a scaling factor corresponding to the size of scaling of implemented on modified mesh representation 130. In an aspect, resonance engine 124 updates the air pressure coefficient matrix based on identifying one or more modified vertices of internal cavity 202 in modified mesh representation 130. Resonance engine 124 updates the output resonant frequency based on the updated air coefficient. Once resonance engine 124 updates the mesh representation, resonance engine 124 may return to step 606.

Referring to step 618, when 3-D modeling engine 122 determines at step 608 that no indication was received to modify the mesh representation, 3-D modeling engine 122 exports mesh representation 130. In an aspect, 3-D modeling engine 122 joins the outer surface mesh, inner cavity mesh, and holes 206, 208, 210 into a final mesh for mesh representation 130. In some embodiments, 3-D modeling engine 122 may add a nozzle to fipple hole 206 to act as a mouthpiece. In an aspect, 3-D modeling engine 122 saves the final mesh representation 130 in system memory 112.

After saving final mesh representation 130 in system memory 112, 3-D modeling engine 122 may terminate method 600 at step 620.

Figure 6B:
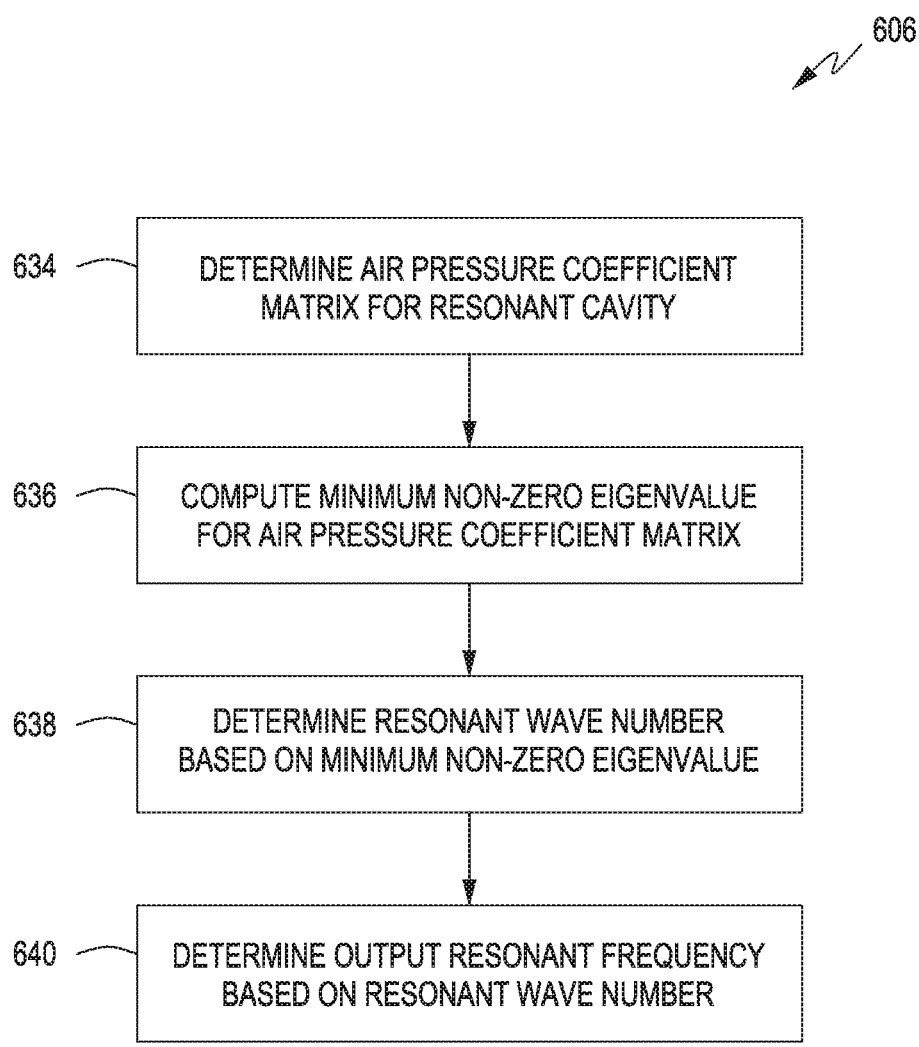
FIG. 6B sets forth a flow diagram of the sub-steps associated with step 606 of FIG. 6A, according to various embodiments of the present invention.

FIG. 6B sets forth a flow diagram of the sub-steps associated with step 606 of FIG. 6A, according to various embodiments of the present invention. Resonance engine 124 implements step 606 on mesh representation 130.

At step 634, resonance engine 124 determines an air pressure coefficient for resonant cavity 201 of mesh representation 130. Resonant cavity 201 includes internal cavity 202 and holes 206, 208, 210. The air pressure coefficient matrix for resonant cavity 201 is proportional to the magnitude of the incident air pressure against the surface of resonant cavity 201 compared to the reflected air pressure from the surface of resonant cavity 201. In an aspect, resonance engine 124 determines the air pressure coefficient matrix for resonant cavity 201 based on a specific finger hole pattern 230 for mesh representation 130. Finger hole pattern 230 modifies the volume and shape of resonant cavity 201 and thus modifies the air pressure coefficient matrix.

At step 636, resonance engine 124 computes a minimum, non-zero eigenvalue for the air pressure coefficient matrix of resonant cavity 201. Using the air pressure coefficient matrix, resonance engine 124 finds the minimal reflection pressure on resonant cavity 201 by finding the magnitude of the minimum, non-zero eigenvalue that solves the air pressure coefficient matrix. When the minimum eigenvalue is small, the reflection pressure becomes large compared to the incident air pressure against the resonant cavity surface.

At step 638, resonance engine 124 determines a resonant wave number based on the minimum, non-zero eigenvalue calculated at step 636. As illustrated by eigenvalue line 380, minimum eigenvalues 382, 384 that solve the air pressure coefficient matrix correspond to wave numbers for resonant cavity 201. In an aspect, resonance engine 124 samples a discrete number of wave numbers and subtracts the sampled wave number from the real part of the minimum, non-zero eigenvalue to determine the resonant wave number.

At step 640, resonance engine 124 determines the output resonant frequency 512 based on the resonant wave number determines at step 638. Resonance engine 124 multiplies the resonant wave number determined with the speed of sound to determine the output resonant frequency 512 of resonant cavity 201. Once resonance engine 124 determines the output resonant frequency 512, resonance engine 124 may end method 630 at step 642.

Figure 6C:
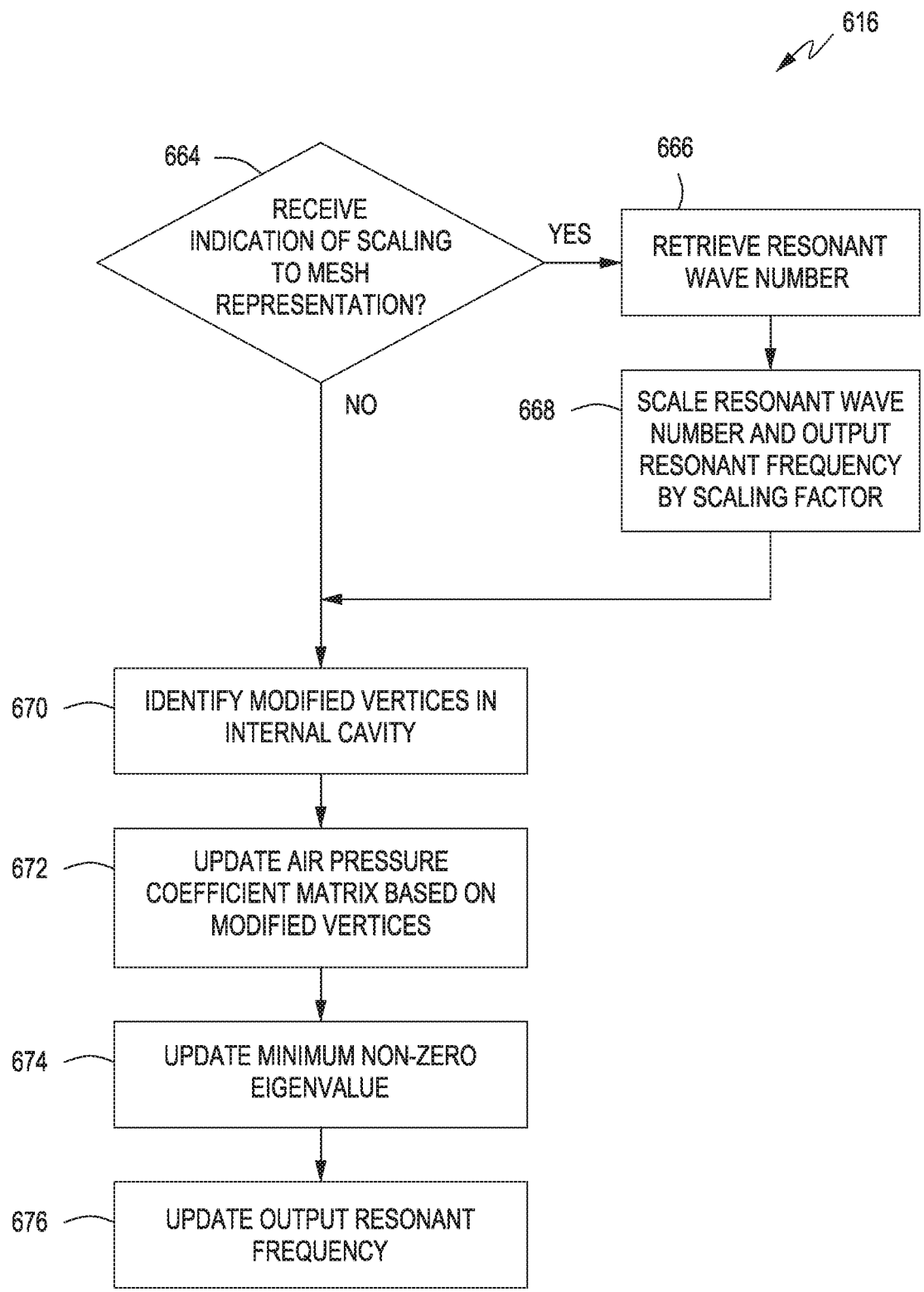
FIG. 6C sets forth a flow diagram of the sub-steps associated with step 616 of FIG. 6A, according to various embodiments of the present invention.

FIG. 6C sets forth a flow diagram of the sub-steps associated with step 616 of FIG. 6A, according to various embodiments of the present invention. Resonance engine 124 implements step 616 on mesh representation 130 after 3-D modeling engine 122 modifies mesh representation 130.

At step 664, resonance engine 124 determines whether an indication was received that indicated a scaling of mesh representation 130. In an aspect, resonance engine 124 receives an indication from 3-D modeling engine 122 that mesh representation 130 has been enlarged or diminished by a specified scaling factor, s. If resonance engine 124 determines that an indication of a scaling to mesh representation 130 was received, resonance engine 124 proceeds to step 666; otherwise, resonance engine 124 proceeds to step 670.

At step 666, resonance engine 124 retrieves each resonant wave number corresponding to mesh representation 130. In an aspect, mesh representation 130 includes wave numbers for corresponding to an output resonant frequency for each possible finger pattern 514. In an aspect, resonance engine 124 retrieves each resonant wave number from system memory 112.

At step 668, resonance engine 124 scales each output resonant frequency corresponding to the retrieved resonant wave numbers by an inverse of scaling factor (1/s) corresponding to the scaling of mesh representation 130. Once resonance engine 124 updates the mesh representation for mesh representation 130, resonance engine 124 proceeds to step 670.

At step 670, resonance engine 124 identifies one or more modified vertices in inner cavity 202. In some embodiments, changes to of one or more hole positions in mesh representation 130 may modify one or more vertices in inner cavity 202. Resonance engine 124 identifies the set of vertices that were modified due to the change in hole configuration.

At step 672, resonance engine 124 updates the air pressure coefficient matrix based on the modified vertices that were identified at step 670. In an aspect, resonance engine 124 updates the air pressure coefficient matrix by updating the row and column of the air pressure coefficient matrix corresponding to each vertex that was identified as modified.

At step 674, resonance engine 124 updates the minimum, non-zero eigenvalue by solving for the air pressure coefficient matrix that was updated at step 672. In some embodiments, resonance engine 124 may determine the minimum, non-zero eigenvalue for each finger hole pattern 514.

At step 676, resonance engine 124 updates the output resonant frequency 512 based on the updated minimum, non-zero eigenvalue. In an aspect, resonance engine updates the resonant wave number based on the updated minimum, non-zero eigenvalue, and multiplies the updated resonant wave number by the speed of sound to update the output resonant frequency 512. Once resonance engine 124 updates the output resonance frequency at step 672, resonance engine 124 may terminate method 660 at step 678.

In sum, the three-dimensional (3-D) resonance system receives a 3-D mesh representation that has a resonant cavity that includes an internal cavity and one or more holes. Based on the resonant cavity and hole configuration of the 3-D mesh representation, the 3-D resonance system uses a resonance engine to determine output resonant frequencies for finger hole patterns based on the hole configuration of the mesh representation. The 3-D resonance system enables a user to add and modify one or more holes on mesh representation 130. The 3-D resonance system also simulates an output resonant frequency based on hole configuration of mesh representation 130 and plays an audio signal corresponding to the output resonant frequency.

The resonance engine of the 3-D resonance system quickly calculates the output resonance frequency by approximating an air pressure coefficient matrix for the resonant cavity of the mesh representation and finding a minimum, non-zero eigenvalue that solves the air pressure coefficient matrix. The resonance engine determines the output resonant frequency from the calculated minimum, non-zero eigenvalue.

The output resonant frequencies for certain finger hole patterns approximate target output resonant frequencies. For example, the target output resonant frequencies could correspond to notes on a musical scale. The system enables the user, via the interactive resonance GUI, to modify the hole configuration of the mesh representation, with the resonance engine producing the updated output resonant frequency of the new hole configuration. The system also enables a user, via the resonance GUI, to use an optimization engine to the hole configuration. Using manual manipulation of the mesh representation or the optimization engine, simulation GUI enables the user to resonant cavities that produce one or more target output resonant frequencies when using one or more finger hole patterns. The 3-D resonance system provides a mesh representation that the user can produce as a three-dimensional, physical object, that an end-user can play and produce the output resonant frequencies simulated by the resonance engine.

At least one advantage of the disclosed embodiments is that the simulator provides a fast method of simulating multiple frequencies for a free-form cavity, thereby enabling a user to find resonant frequencies for the cavity. The resonance simulator enables a user to interactively manipulate the structure of the three-dimensional shape by changing the size and placement of holes around the three-dimensional shape to produce output resonant frequencies that are approximately close to one or more targeted output resonant frequencies. As a result, enabling the user to easily simulate resonance and design free-form shapes to produce one or more targeted output tones based on the shape and placement of holes allows the user to design and fabricate free-form wind instruments based on designs of acoustic resonators produced in the simulator.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for simulating an audio output of a three-dimensional object that includes a resonant cavity, the method comprising:
   receiving an input mesh of a three-dimensional shape and a hole configuration specifying one or more holes, wherein the input mesh has an outer surface and an internal cavity;
   generating a modified mesh based on the hole configuration, wherein generating the modified mesh includes adding the one or more holes to the input mesh to form a resonant cavity, wherein the resonant cavity includes the one or more holes and the internal cavity;
   determining an air pressure coefficient matrix for the resonant cavity;
   computing a minimum non-zero eigenvalue for the air pressure coefficient matrix for the resonant cavity;
   determining an output resonant frequency for the resonant cavity based on the minimum non-zero eigenvalue;
   receiving an updated hole configuration;
   generating an updated mesh based on the updated hole configuration that represents an updated resonant cavity;
   identifying a set of vertices of the updated mesh that are changed from the modified mesh due to the updated hole configuration;
   generating an updated air pressure coefficient matrix for the updated resonant cavity based on the set of vertices; and determining an updated output resonant frequency for the updated resonant cavity based on the updated air pressure coefficient matrix.

2. The method of claim 1, further comprising:
computing a second minimum non-zero eigenvalue for the updated air pressure coefficient matrix, wherein the updated output resonant frequency for the updated resonant cavity is determined based on the second minimum non-zero eigenvalue.

3. The method of claim 2, further comprising:
moving at least one of the one or more holes to a second hole position; and
generating the updated hole configuration based on the second hole position.

4. The method of claim 2, further comprising:
scaling the input mesh, wherein a size of the internal cavity, outer surface, and one or more holes changes based on a scaling factor; and
generating the updated hole configuration based on the scaling of the input mesh.

5. The method of claim 1, wherein the hole configuration comprises a plurality of finger hole patterns, wherein each finger hole pattern indicates which holes included in the one or more holes is covered by a finger of a user.

6. The method of claim 5, wherein the steps of determining the air pressure coefficient matrix, computing the minimum non-zero eigenvalue for the air pressure coefficient matrix, and determining the output resonant frequency are performed for each finger hole pattern included in the hole configuration.

7. The method of claim 1, further comprising:
receiving a target output resonant frequency;
modifying at least one diameter associated with the one or more holes based on the target output resonant frequency to generate at least one modified diameter; and
determining a second output resonant frequency based on the at least one modified diameter.

8. The method of claim 7, wherein a difference between the target output resonant frequency and the second output resonant frequency is less than or equal to 3 Hz.

9. The method of claim 1, further comprising:
receiving a modified hole configuration that includes a change in at least one diameter associated with the one or more holes;
determining a second output resonant frequency based on the change in the at least one diameter.

10. The method of claim 9, wherein the air pressure coefficient matrix does not change based on the modified hole configuration.

11. The method of claim 1,
wherein the hole configuration is received from a user via a graphical user interface (GUI);
wherein receiving the hole configuration includes at least one of receiving a diameter for a first hole included in the one or more holes via a first GUI tool for specifying a hole diameter or receiving a thickness for the first hole via a second GUI tool for specifying a hole thickness; and
wherein the thickness for the first hole spans from the outer surface to the internal cavity of the input mesh.

12. The method of claim 1, wherein generating the updated air pressure coefficient matrix comprises updating a row and a column of the air pressure coefficient matrix corresponding to each vertex included in the set of vertices.

13. The method of claim 1, wherein the minimum non-zero eigenvalue for the air pressure coefficient matrix for the resonant cavity indicates a minimal reflection air pressure associated with the resonant cavity.

14. One or more non-transitory computer-readable media including instructions that, when executed by one or more processors, cause the one or more processors to perform the steps of:
receiving an input mesh of a three-dimensional shape and a hole configuration specifying one or more holes, wherein the input mesh has an outer surface and an internal cavity;
generating a modified mesh based on the hole configuration, wherein generating the modified mesh includes adding the one or more holes to the input mesh to form a resonant cavity, wherein the resonant cavity includes the one or more holes and the internal cavity;
determining an air pressure coefficient matrix for the resonant cavity;
computing a minimum non-zero eigenvalue for the air pressure coefficient matrix for the resonant cavity;
determining an output resonant frequency for the resonant cavity based on the minimum non-zero eigenvalue;
receiving an updated hole configuration;
generating an updated mesh based on the updated hole configuration that represents an updated resonant cavity;
identifying a set of vertices of the updated mesh that are changed from the modified mesh due to the updated hole configuration;
generating an updated air pressure coefficient matrix for the updated resonant cavity based on the set of vertices; and
determining an updated output resonant frequency for the updated resonant cavity based on the updated air pressure coefficient matrix.

15. The one or more non-transitory computer-readable media of claim 14, further comprising instructions that, when executed by a processor, cause the process to further perform the steps of:
generating an audio signal corresponding to the output resonant frequency.

16. The one or more non-transitory computer-readable media of claim 14, wherein one of the one or more hole comprises a fipple hole.

17. The one or more non-transitory computer-readable media of claim 11, further comprising instructions that, when executed by a processor, cause the process to further perform the steps of:
receiving a target output resonant frequency;
modifying at least one diameter associated with the one or more holes based on the target output resonant frequency to generate at least one modified diameter; and
determining a second output resonant frequency based on the at least one modified diameter.

18. The one or more non-transitory computer-readable media of claim 17, wherein the hole configuration comprises a plurality of finger hole patterns, wherein each finger hole pattern indicates which holes included in the one or more holes is covered by a finger of a user.

19. The one or more non-transitory computer-readable media of claim 18, wherein the steps of receiving a target output resonant frequency, modifying at least one diameter associated with the one or more holes based on the target output resonant frequency to generate at least one modified diameter, and determining a second output resonant frequency based on the at least one modified diameter are performed for each finger hole pattern included in the hole configuration.

20. The one or more non-transitory computer-readable media of claim 14, wherein determining the output resonant frequency for the resonant cavity based on the minimum non-zero eigenvalue comprises:
   sampling a first wave number;
   subtracting the first wave number from a real part of the minimum non-zero eigenvalue to determine a resonant wave number;
   determining the output resonant frequency for the resonant cavity based on the resonant wave number.

21. The one or more non-transitory computer-readable media of claim 14, further comprising instructions that, when executed by a processor, cause the process to further perform the steps of:
   receiving a modified hole configuration that includes a change in at least one diameter associated with the one or more holes;
   determining a second output resonant frequency based on the change in the at least one diameter.

22. The one or more non-transitory computer-readable media of claim 14, further comprising instructions that, when executed by a processor, cause the process to further perform the steps of:
   computing a second minimum non-zero eigenvalue for the updated air pressure coefficient matrix, wherein the updated output resonant frequency for the updated resonant cavity is determined based on the second minimum non-zero eigenvalue.

23. A system, comprising:
   a memory storing instructions; and
   a processor coupled to the memory that executes the instructions to perform the steps of:
      receive an input mesh of a three-dimensional shape and a hole configuration specifying one or more holes, wherein the input mesh has an outer surface and an internal cavity;
      generate a modified mesh based on the hole configuration, wherein generating the modified mesh includes adding the one or more holes to the input mesh to form a resonant cavity, wherein the resonant cavity includes the one or more holes and the internal cavity;
      determine an air pressure coefficient matrix for the resonant cavity;
      compute a minimum non-zero eigenvalue for the air pressure coefficient matrix for the resonant cavity;
      determine an output resonant frequency for the resonant cavity based on the minimum non-zero eigenvalue:
      receive an updated hole configuration;
      generate an updated mesh based on the updated hole configuration that represents an updated resonant cavity;
      identify a set of vertices of the updated mesh that are changed from the modified mesh due to the updated hole configuration;
      generate an updated air pressure coefficient matrix for the updated resonant cavity based on the set of vertices; and
      determine an updated output resonant frequency for the updated resonant cavity based on the updated air pressure coefficient matrix.

* * * * *

UNITED STATES PATENT AND TRADEMARK OFFICE
CERTIFICATE OF CORRECTION

PATENT NO. : 11,798,521 B2  
APPLICATION NO. : 15/650819  
DATED : October 24, 2023  
INVENTOR(S) : Nobuyuki Umentani Page 1 of 1

It is certified that error appears in the above-identified patent and that said Letters Patent is hereby corrected as shown below:

On the Title Page

(56) References Cited:

Please delete "Howie, V. E., and Lloyd N. Trefethen. "Eigenvalues and musical instruments." Journal of computational and applied mathematics 135.1 (2001): 23-40. (Year: 2001). *" and insert --Howle, V. E., and Lloyd N. Trefethen. "Eigenvalues and musical instruments." Journal of computational and applied mathematics 135.1 (2001): 23-40. (Year: 2001). *--;

Please delete "Garashi et al., Teddy: A sketching Interface for 3d Freeform Design, In Proceedings of SIGGRAPH, 1999, pp. 409-416." and insert --Igarashi et al., Teddy: A sketching Interface for 3d Freeform Design, In Proceedings of SIGGRAPH, 1999, pp. 409-416.--;

In the Claims

Column 20, Claim 17, Line 45, please delete "claim 11" and insert --claim 14--.

Signed and Sealed this  
Thirtieth Day of January, 2024

Katherine Kelly Vidal  
*Director of the United States Patent and Trademark Office*